United States Patent [19]

Provancher

[11] 4,155,801

[45] May 22, 1979

[54] PROCESS FOR MASKING SHEET METAL FOR CHEMICAL MILLING

[75] Inventor: Donald A. Provancher, Chula Vista, Calif.

[73] Assignee: Rohr Industries, Inc., Chula Vista, Calif.

[21] Appl. No.: 846,182

[22] Filed: Oct. 27, 1977

[51] Int. Cl.² ............................................. C23F 1/02
[52] U.S. Cl. .................................. 156/630; 156/241; 156/249; 156/253; 156/634; 156/644; 156/656; 156/659; 156/660; 156/661
[58] Field of Search .............................. 156/629–631, 156/634, 644, 654, 656, 664–666, 660, 661, 659, 230–241, 247, 249, 252, 253; 204/129.55, 129.65; 96/35.1, 36.1, 83

[56] References Cited

U.S. PATENT DOCUMENTS

| | | | |
|---|---|---|---|
| 3,415,699 | 12/1968 | Brown | 156/644 X |
| 3,718,473 | 2/1973 | Gervay et al. | 96/83 |
| 4,054,483 | 10/1977 | Peiffer | 96/35.1 X |

FOREIGN PATENT DOCUMENTS

917329  2/1963  United Kingdom ............... 156/660

*Primary Examiner*—William A. Powell
*Attorney, Agent, or Firm*—Patrick J. Schlesinger; Frank D. Gilliam

[57] ABSTRACT

This process comprises the steps of depositing a suitable maskant which is resistant to the chemicals used in chem-milling on a back-up sheet such as thin plastic, punching or cutting the desired pattern to be removed from the sheet metal through the maskant and the back-up sheet, then applying the maskant by adhering the same to the sheet metal surface with the plastic back-up sheet on the outside surface. The back-up sheet/maskant combination is placed on both sides of the sheet metal where the thickness of the sheet metal requires chem-milling from both surfaces. For thin metal, one surface of the material can be directly coated with the maskant while the other surface employs the back-up sheet/maskant combination. After the adhesive operation, the plastic back-up sheet is then removed from the maskant and the sheet metal, with the maskant then remaining on the sheet metal, the sheet metal is then deposited in an appropriate chem-mill solution and the openings through the maskant material are caused to be etched away, the maskant is then removed from the finished sheet metal.

2 Claims, 4 Drawing Figures

PROCESS FOR MASKING SHEET METAL FOR CHEMICAL MILLING

BACKGROUND OF THE INVENTION

The instant invention relates to chem-milling of sheet metal and, more particularly, to the preparation of the sheet metal with a maskant so that only selected areas will be etched away in the chem-milling process.

Conventional methods of manufacturing perforated sheet metal by mechanically punching and drilling, laser and electron beam fusion drilling, although highly successful for certain utilization of perforated material, has been found to cause an increase in the occurrence of metal fatigue and provides a high stress to the material adjacent the holes which results in warpage of the flat surface of the material; when the warpage occurs, an additional operation for flattening the material is required.

The problems existing in the current state of the art have not been successfully overcome until emergence of the instant invention.

SUMMARY OF THE INVENTION

This invention provides a convenient method for producing a sheet of material that has selective uniform openings therethrough after the chem-milling process and requires no further operation, such as trim or flattening.

The main object of this invention is to produce a template suitable for use on flat material which results in a reduction of manufacturing steps in producing the final perforated material from base material such as titanium, inconel, aluminum and and other types of metal material that may be subject to a chem-milling process.

Another object of this invention is to produce acoustic panels that contain perforations of selected and uniform size.

Other objects, features and advantages of this invention will become apparent from the following descriptions taken in conjunction with the accompanying drawings.

BRIEF DESCRIPTION OF THE DRAWINGS

The same reference numerals used through the specifications and figures depict the identical part or element.

DESCRIPTION OF PREFERRED EMBODIMENT

Figure 1:
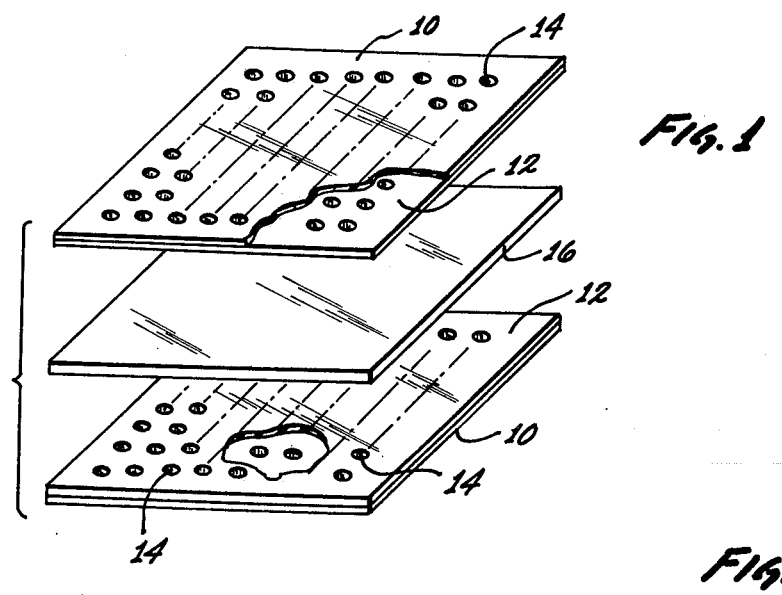
FIG. 1 shows a perspective exploded view of the various components of the masking process of the invention.
Figure 2:
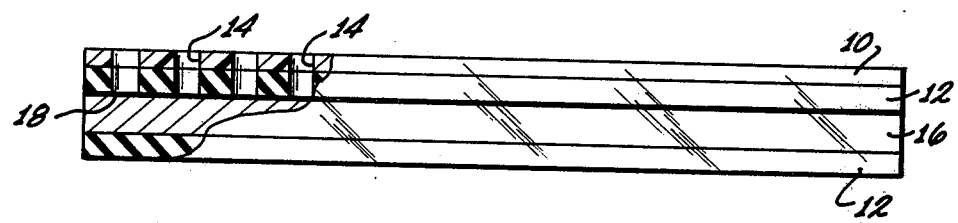
FIG. 2 is a side view of a portion of FIG. 1.

FIGS. 1 and 2 depict a lubricious plastic backing sheet 10 with a layer of maskant 12 deposited thereon. The maskant may be deposited in any manner that provides a uniform coating on the backing sheet. The backing sheet can take many forms, it is required to be pliable so that the combined plastic sheet and maskant can be rolled for storage, etc., and be lubricious enough to allow the backing sheet to be removed from the maskant material. It has been found for successful, practical operations that a piece of plastic material of approximately 4/1000ths of an inch can be used. However, this should not be considered a limiting factor in this invention, as any type of material could be used of any practical thickness. The invention has been successfully practiced with a rubber based maskant 12 deposited on the backing sheet 10 by spraying to a thickness of approximately 5/1000ths of an inch. This also should not be considered limiting, as any convenient thickness or any convenient chem-milled resistant maskant may be used equally as well.

Referring now to the various figures, the maskant and backing sheet combination is prepared with the desired number and size of openings 14 therethrough. Although in FIG. 2 the openings 14 comprise a plurality of uniformly sized apertures through the plastic backing sheet and the rubber maskant, this should not be considered limiting, as any design or configured opening could be provided through the material and the invention could be practiced equally as well.

Figure 3:
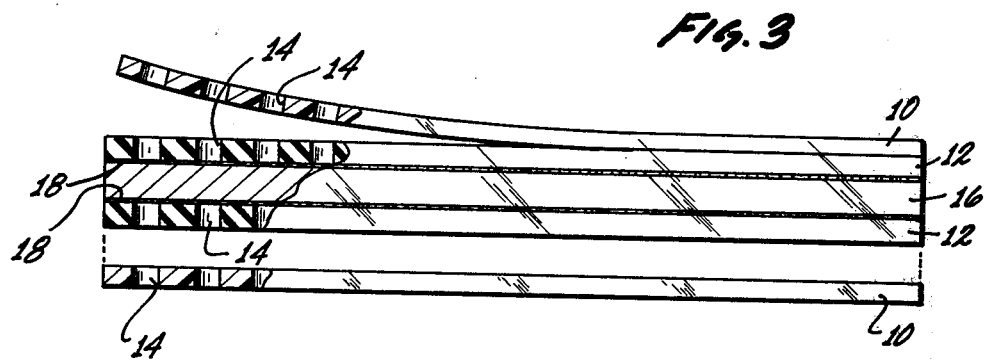
FIG. 3 is a side view of FIG. 1 with showing the elements removed prior to chem-milling of the flat sheet metal material.

Referring now specifically to FIG. 2, after the sheet of plastic backing material 10 and maskant 12 is prepared with the selected openings 14, it is then placed upon a sheet of metal 16 to be chemically milled or machined. The placement is with the rubber based maskant material 12 adjacent one surface of the sheet of metal 16. Prior to the actual placement on the sheet metal 16 a layer of adhesive 18 is placed either on the sheet metal 16 or the rubber based maskant 12 side of the combination plastic backing sheet 10 and rubber based maskant 12, or could be lightly placed on both surfaces. This adheres the rubber based surface mechanically to the sheet of metal 16. Referring now to FIG. 3, after the adhesive solution is cured, the plastic backing sheet 10 is then removed from the other surface of the rubber maskant material. In some instances, particularly where the sheet metal to be chemically milled or machined is of a small thickness, such as 1/1000th of an inch or slightly larger, only one combination plastic backing sheet and rubber maskant is required, the opposite side of the sheet metal 16 has a solid coating of a similar rubber maskant material deposited thereon (see FIG. 2). In cases where the sheet metal to be chemically milled or machined is of greater thickness wherein it must be chem-milled from both sides to prevent tapering of the openings therethrough, a second backing sheet with rubber based maskant 12, as hereinbefore described, would also be deposited on the opposite side of the sheet metal 16 in a similar manner (see FIGS. 1 and 3). When two sheets are being used, attention must be paid to the application of the sheets as to the alignment of their apertures between the two sheets, they must be absolutely aligned so that the final etching through the sheet metal 16 is symmetrical.

Figure 4:
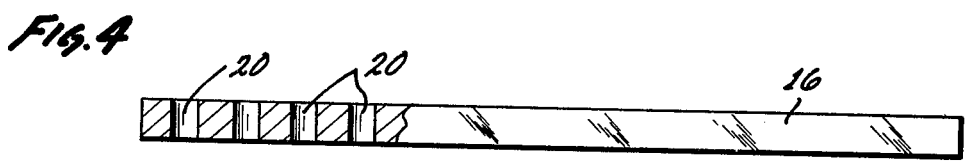
FIG. 4 is a side view of the final chem-milled flat sheet metal with apertures therethrough.

After the chem-mill process has been completed, the rubber maskant 12 adhering to each side thereof is removed by any convenient well-known means. The resulting piece of flat sheet material having perforations 20 (see FIG. 4) is now ready to be used in its selected application.

It will be apparent to those skilled in the art, that many modifications and variations may be affected without departing from the spirit and scope of the novel concept of the present invention.

What is claimed to be covered by United States Letters Patent is:

1. A process of masking sheet metal for chem-milling openings therethrough comprising the steps of:

(a) depositing a layer of chem-mill resistant material on a sheet of pliable lubricious material;
(b) providing selected openings through the combined layer of chem-mill resistant material and the sheet of pliable lubricious material;
(c) adhering the pliable lubricious material with the layer of chem-mill resistant material on one surface of the sheet metal
(d) coating the remaining surfaces of said sheet metal with a layer of chem-mill resistant material;
(e) removing the sheet of pliable lubricious material prior to chem-milling
(f) chem-milling the sheet of sheet metal with the maskant deposited thereon, and
(g) removing the maskant from the chem-milled sheet metal.

2. A process of masking a thick piece of sheet metal for chem-milling openings therethrough comprising the steps of, (a) depositing a layer of chem-mill resistant material on one side of two sheets of pliable lubricious material;
(b) providing symetrical openings through both of the separate combined layers of chem-mill resistant material and the sheets of pliable lubricious material;
(c) adhering the resistant material sides of the sheets of pliable lubricious material to the opposing surfaces of the piece of sheet metal, with the symetrical openings in alignment;
(d) coating the remaining surfaces of the sheet metal with a layer of chem-mill resistant material;
(e) removing the sheet of pliable lubricious material prior to chem-milling;
(f) chem-milling the sheet of sheet metal with the maskant deposited thereon, and
(g) removing the maskant from the chem-milled sheet metal.

* * * * *